(12) United States Patent
Singh et al.

(10) Patent No.: US 7,536,661 B1
(45) Date of Patent: May 19, 2009

(54) INCREMENTAL PLACEMENT DURING PHYSICAL SYNTHESIS

(75) Inventors: Amit Singh, San Jose, CA (US); Kamal Chaudhary, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 433 days.

(21) Appl. No.: 11/361,370

(22) Filed: Feb. 24, 2006

(51) Int. Cl.
*G06F 17/50* (2006.01)

(52) U.S. Cl. .................. 716/2; 716/8; 716/9; 716/10; 716/18

(58) Field of Classification Search .................. 716/2, 716/5–12, 18
See application file for complete search history.

(56) References Cited

U.S. PATENT DOCUMENTS

| | | | |
|---|---|---|---|
| 5,397,749 A | | 3/1995 | Igarashi |
| 5,854,752 A | * | 12/1998 | Agarwal ........................ 716/7 |
| 6,178,539 B1 | | 1/2001 | Papadopoulou et al. |
| 6,543,032 B1 | | 4/2003 | Zolotykh et al. |
| 7,217,048 B2 | | 5/2007 | King et al. |
| 7,328,421 B1 | * | 2/2008 | Ballagh et al. ................ 716/12 |
| 2006/0190224 A1 | | 8/2006 | Xu |

OTHER PUBLICATIONS

U.S. Appl. No. 11/361,369, filed Feb. 24, 2006, Singh, Amit, et al., entitled "Enhanced Incremental Placement During Physical Synthesis", Xilinx, Inc. 2100 Logic Drive, San Jose, CA 95124.

* cited by examiner

*Primary Examiner*—Paul Dinh
(74) *Attorney, Agent, or Firm*—Kevin T. Cuenot (57) ABSTRACT

A method of optimizing a portion of a circuit design for a target device can include identifying a critical region from a plurality of regions after an initial placement of the circuit design. The critical region can be defined, at least in part, by at least one input block and at least one output block. Blocks of the critical region can be relocated to different sites within the critical region. The method further can include evaluating the relocation of blocks of the critical region according to a cost function and continuing to relocate blocks and evaluate the relocation of blocks in the critical region until at least one exit criterion is met.

14 Claims, 4 Drawing Sheets

INCREMENTAL PLACEMENT DURING PHYSICAL SYNTHESIS

BACKGROUND

1. Field of the Invention

The present invention relates to circuit design and, more particularly, to optimizing portions of a circuit design for a target device.

2. Description of the Related Art

Synthesis refers to the process of translating an abstract representation of a circuit design into a physical implementation of that circuit design on some variety of electronic device, such as a programmable logic device (PLD). The abstract representation of the circuit design usually is specified in programmatic form using a Hardware Description Language (HDL). On a more detailed level, synthesis of a circuit design refers to both logic synthesis and physical synthesis.

In general, logic synthesis refers to the translation of a Register Transfer Level (RTL) representation of a circuit design written in HDL into a gate-level representation of the circuit design. The gate-level representation is often specified as a netlist of logic primitives. Logic synthesis is performed purely according to the circuit design and the logical structure of the target device. No regard is accorded to the physical implementation, in reference to the placement of the circuit design. Thus, no wire delays, or estimates of wire delays, are used when determining the operational speed of the circuit design during logic synthesis.

By comparison, physical synthesis refers, in general, to re-synthesizing the gate-level representation of the circuit design. This re-synthesis accounts for delays (or estimates of delays) of wires used to interconnect the various blocks of the circuit design on the target device. At this point, timing criticality of various portions of the circuit design on the target device can be evaluated. Re-synthesis undertaken during physical synthesis is an effective way of optimizing the circuit design since the process occurs closer to the actual physical implementation phase and, thus, more accurately models circuit behavior when determining whether design goals have been, or will be, met.

During physical synthesis, the components of the circuit design are assigned to specific locations on the target device and then routed. The process of assigning components to specific sites of the target device is referred to as "placement". Typically, components of the circuit design are placed by attempting to optimize objectives including, but not limited to, total wire length of the physical implementation, the timing characteristics of the physical implementation, congestion, power consumption, and the like. As the circuit design has not yet been routed, quantities involving timing and wire length are computed using various estimating techniques.

In any case, the optimization of these objectives usually is performed on a global level with respect to the entire circuit design. With a view on global optimization, however, it often is the case that one or more regions of the circuit design are implemented in a less than optimal fashion. One example of this situation pertains to wire length and timing. Optimizing the global wire length of a circuit design tends to conserve limited routing resources. If wire length is valued too highly, one or more regions of the circuit design may suffer in terms of timing. That is, in an effort to reduce the total wire length of the circuit design, one or more regions of the circuit design may not meet established timing requirements. Once the circuit design is placed, it can be routed.

In such situations, it may be necessary to modify the circuit design to ensure that the resulting physical implementation meets all established objectives, including timing. Conventional techniques for dealing with this problem have involved multiple iterations between re-synthesis and place and route tools until the results are satisfactory. This iterative process, however, can be very time consuming, particularly since the entire circuit design, comprising upwards of thousands of netlist regions, is optimized during physical synthesis.

It would be beneficial to implement changes in a circuit design in a manner which overcomes the limitations described above.

SUMMARY

The present invention provides a method and article of manufacture relating to the optimization of selected regions of a circuit design. One embodiment of the present invention can include a method of optimizing a portion of a circuit design for a target device. The method can include identifying a critical region from a plurality of regions after an initial placement of the circuit design. The critical region can include at least one input block and at least one output block. Blocks of the critical region can be relocated to different sites within the critical region. The method further can include evaluating the relocation of the blocks of the critical region according to a cost function and continuing to relocate blocks and evaluate the placement of blocks in the critical region until at least one exit criterion is met.

The critical region can have a predetermined functionality. Accordingly, the critical region optionally can be re-synthesized while preserving the predetermined functionality. The critical region further can be defined by including each block located on a path between the input block and the output block of the critical region as part of the critical region.

The relocation of blocks can include selecting only blocks within the critical region for relocation to other sites within the critical region. The continuation of the relocation and evaluation of blocks can include comparing a result obtained from an evaluation of the cost function with a predetermined exit criterion. The continuation of the relocation and evaluation further can include determining a number of relocation and evaluation iterations and comparing the number of iterations with a predetermined exit criterion.

Another embodiment of the present invention can include a method of optimizing a portion of a circuit design for a target device which includes defining a plurality of regions of an initial placement of the circuit design, identifying a critical region from the plurality of regions according to a timing analysis, and incrementally placing only blocks of the critical region until an exit criterion is met.

The incremental placement of blocks of the critical region can include selecting only blocks within the critical region, relocating selected blocks to different sites within the critical region, and evaluating the relocation of blocks of the critical region according to a cost function. A result obtained from an evaluation of the cost function can be compared with an exit criterion.

The method further can include defining the critical region by at least one input and at least one output. Each block located on a path between the input and the output of the critical region can be included in the critical region. The critical region can have a defined functionality. Accordingly, the critical region can be re-synthesized while preserving the defined functionality. Incrementally placing blocks of the critical region can include comparing a number of incremental placement iterations with an exit criterion.

Yet another embodiment of the present invention can include a machine readable storage, having stored thereon a computer program having a plurality of code sections for performing the various steps and/or functions described herein.

BRIEF DESCRIPTION OF THE DRAWINGS

There are shown in the drawings, embodiments which are presently preferred, it being understood; however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The present invention includes a technique which allows circuit designers to implement changes to a circuit design after the circuit design has been placed for a specified device. In accordance with the embodiments disclosed herein, one or more timing-critical portions of a circuit design can be identified or selected for modification. Within a selected portion, blocks can be re-synthesized and relocated to different sites within that portion using any of a variety of placement techniques. The newly developed placement for the region can be evaluated according to a cost function or other predetermined evaluation criteria. The embodiments disclosed herein allow one or more timing-critical portions of a circuit design to be changed, or altered, after the circuit design has been placed without having to re-synthesize and/or re-place the entire circuit design, thereby saving a significant amount of time.

Figure 1:
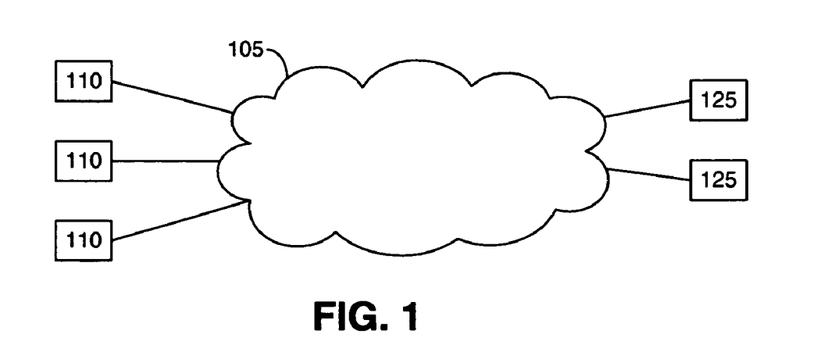
FIG. 1 is a block diagram illustrating a region of a circuit design which is useful for understanding the embodiments disclosed herein.

FIG. 1 is a block diagram illustrating a region 105 of a circuit design which is useful for understanding the embodiments disclosed herein. Region 105 represents a portion of a circuit design which has been placed for a specific target device, such as an Application Specific Integrated Circuit (ASIC), or a programmable logic device (PLD) such as a Field Programmable Gate Array (FPGA). In general, region 105 is defined by the particular function that is implemented by the region as well as the inputs and outputs of the region. While the circuit design includes a plurality of regions, one or more regions can be identified for optimization. Such regions, i.e., region 105, can be referred to as the Region Under Optimization (RUO).

As noted, region 105 is defined, at least in part, by the input(s) to and output(s) from the region. In this case, for example, region 105 is defined by the input blocks 110 and the output blocks 125. Signals from input blocks 110 are provided to various blocks within region 105 and output signals from region 105 are provided to the output blocks 125. Any signal paths located between or connecting blocks 110 and 125, as well as blocks used to process signals along such paths, are deemed to be a part of region 105. As used herein, a block refers to a circuit element such as a lookup table (LUT), a flip flop, an application specific circuit, or the like, which implements a particular function.

With this in mind, it should be appreciated that the structure of region 105 need not be considered static or unchanging. If the blocks of region 105 are re-synthesized and moved to different sites, the structure of region 105 will likely change. Region 105 still, however, is defined by input blocks 110 and output blocks 125 and includes paths and blocks on such paths between input blocks 110 and output blocks 125. The functionality of region 105 will remain the same throughout re-synthesis and re-placement. In any case, while region 105 is defined by a plurality of input blocks 110 and output blocks 125, region 105 also can be defined by a single input block 110 and a plurality of output blocks 125, a plurality of input blocks 110 and a single output block 125, or a single input block 110 and a single output block 125.

Figure 2:
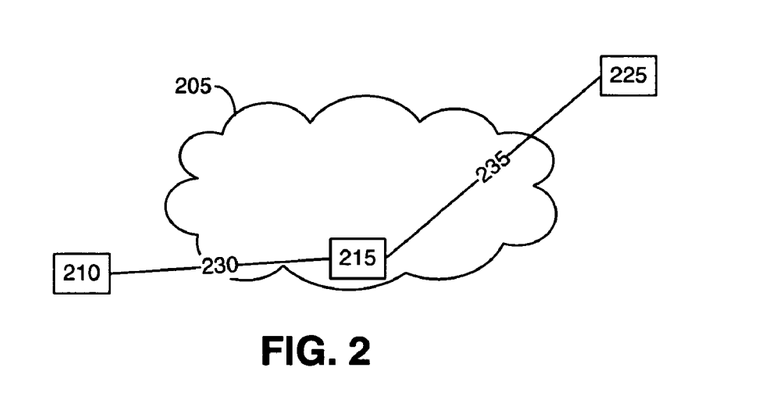
FIG. 2 is a block diagram illustrating a region of a circuit design which is useful for understanding the embodiments disclosed herein.

FIG. 2 is a block diagram illustrating a region 205 of a circuit design which is useful for understanding the embodiments disclosed herein. As shown, region 205 is defined by input block 210 and output block 225. Accordingly, signal paths 230 and 235, which link input block 210 and output block 225, are considered to be part of region 205. Block 215, being located along the signal paths included in region 205, also is included in region 205. It should be appreciated that while only a single block is shown, region 205 can include additional blocks. Additional signal paths beyond paths 230 and 235 also can be included. Accordingly, the embodiments disclosed herein are not intended to be limited by the particular number of blocks and/or signal paths included in a particular region. The number of inputs and/or outputs for a region also can vary and is not intended to be a limitation of the present invention.

In any case, for purposes of illustration it can be assumed that region 205 has been identified for optimization. A timing analysis, for example, can be performed after placement which identifies region 205 as being a critical region. Region 205 can be identified as the cause, or a contributor, to the circuit design not meeting an established timing requirement, i.e., a signal path having a negative slack. For example, signal path 230 and/or signal path 235 may be identified as having a path delay that is too long and is the cause, or a contributor to, the circuit design failing a timing requirement.

As known, path slack refers to the difference between the target delay of a signal path and an estimate of the actual delay of the signal path calculated using a simulation tool. A negative slack indicates that the delay for the path is greater than the target delay. The path can be identified as critical in that the time needed for a signal to propagate from endpoint to endpoint of the path is greater than the target or allotted time. A positive slack indicates that the estimated delay for the path is less than the target delay. A slack of zero indicates that the estimated delay is equivalent to the target delay for the path.

Figure 3:
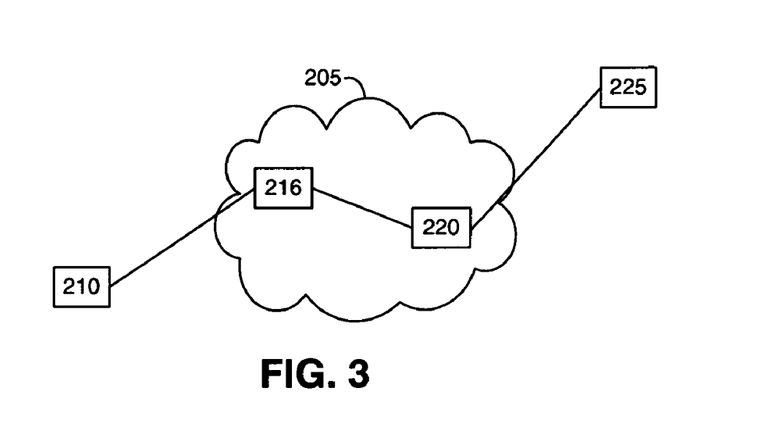
FIG. 3 is a block diagram illustrating the region of FIG. 2 in accordance with one embodiment of the present invention.

FIG. 3 is a block diagram illustrating region 205 of the circuit design in accordance with one embodiment of the present invention. FIG. 3 illustrates the appearance of region 205 after re-synthesis and re-placement. Rather than re-synthesizing or re-placing the entire circuit design to improve timing, region 205 has been identified as the cause, or a contributor to, the circuit design failing to meet a timing requirement. Accordingly, one or more of the blocks of region 205 have been re-synthesized and relocated to different sites within region 205. Region 205 effectively is "re-placed" in an effort to improve the timing characteristics of the overall circuit design. The process of re-synthesizing and re-placing various blocks, however, has been limited to blocks and sites that are considered part of region 205.

In the process of re-synthesizing and re-placing region 205, block 215 of FIG. 2 has been split, or divided, into blocks 216 and 220. It should be appreciated that splitting a block into two or more different blocks or merging two or more blocks into a single block can be performed using available synthesis transformations. Examples of known synthesis transformations that can be applied during the re-synthesis process described herein can include, but are not limited to, replication, switching signals, re-mapping, combining blocks to reduce levels of logic, and the like. Physical synthesis, in general, extends these re-synthesis transformations to account for available placement information.

Regarding placement, any of a variety of placement techniques and/or algorithms can be used so long as such techniques are applied to region 205 and not the entire circuit design. In one embodiment, a technique considered to be an exhaustive search algorithm, such as simulated annealing, can be applied to region 205. In another embodiment, region 205 can be re-placed using an non-exhaustive placement technique. Despite the particular re-placement technique applied to region 205, other regions of the circuit design are not disturbed, nor are the input block(s) 210 and output block(s) 225 of region 205. In consequence, although the shape of region 205 may change, the functionality, input(s) 210, and output(s) 225 do not.

Figure 4:
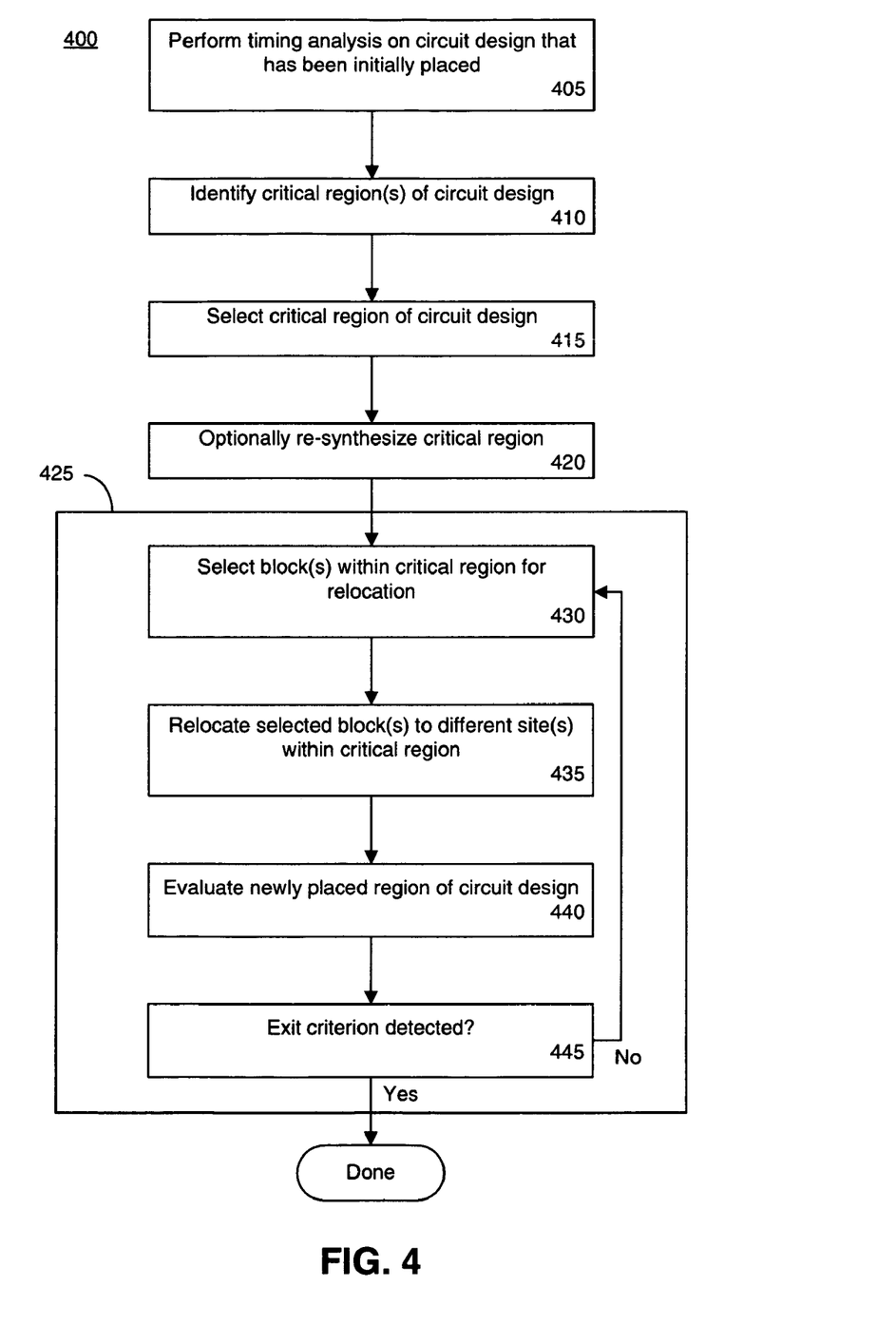
FIG. 4 is a flow chart illustrating a method of optimizing and incrementally placing a region of a circuit design in accordance with another embodiment of the present invention.

FIG. 4 is a flow chart illustrating a method 400 of optimizing and incrementally placing a region of a circuit design in accordance with one embodiment of the present invention. Method 400 can begin in a state where a circuit design has been synthesized and initially placed with respect to a specific target device. The circuit design includes a plurality of different regions, each formed of a plurality of blocks. As noted, each region can be defined according to the functionality provided as well as the input(s) to the region and the output(s) from the region.

In step 405, a timing analysis can be performed on the circuit design after placement. The timing analysis can determine the path slacks for the circuit design on a global level. In step 410, based upon the timing analysis, one or more critical regions of the circuit design can be identified. Critical regions can be those that are the cause, or contribute to, a particular path not meeting an established timing target. In step 415, a critical region can be selected. If one critical region is identified, that region can be automatically selected. If a plurality of critical regions is selected, the user can be provided with a list of critical regions from which to choose or otherwise be prompted to make a selection of a particular critical region. In another embodiment, a critical region that is considered to be "most critical" can be selected. Such a region, for example, can be one that has a path with the largest negative slack. In step 420, the selected critical region optionally can be re-synthesized. As discussed, one or more synthesis transformations can be applied to the selected critical region.

Beginning in block 425, a placement technique can be applied to the selected critical region. It should be appreciated that any of a variety of different placement techniques can be applied, whether exhaustive in nature or not. Notwithstanding the particular technique that is applied, the re-placement process can be limited to operation only within, or upon, the selected critical region. That is, only blocks within the selected critical region are available to be moved and such components may only be moved to sites located within the selected critical region, i.e. to sites along signal paths between the input block(s) and output block(s). Accordingly, rather than applying the placement technique to the entire circuit design, the technique is applied only to the selected critical region.

As discussed, a critical region can be defined by the input block(s) and the output block(s). More particularly, the critical region can be viewed as a bounded region where the perimeter is established by the minimum and maximum placement coordinates of the input block(s) and the output block(s). For purposes of illustration, it can be assumed that an identified critical region has one input block and one output block. If the input to the region has placement coordinates of (X=5, Y=10) and the block driving the output of the critical region is connected to a block outside the critical region having placement coordinates of (X=15, Y=20), the critical region can be said to be bounded by a box defined by the region (X=5:15, Y=10:20). The bounding box can be inflated or expanded by some delta value if exploration of a larger solution space is desired. Sites having coordinates within the bounding box can be said to be within the critical region.

In one embodiment, an exhaustive placement technique can be applied to the critical region in which all sites within the selected critical region can be identified or harvested. Using estimated path delays, components can be assigned to identified sites such that timing criticality is reduced. As noted, any of a variety of different placement techniques can be used so long as the technique is limited to operation within, or upon, the selected critical region. Thus, in step 430, in accordance with a selected placement technique, one or more blocks of the selected critical region can be selected. In step 435, the selected blocks can be relocated to various sites within the critical region.

In step 440, the new placement of the selected critical region can be evaluated. As noted, such evaluation can be performed using a cost function. In one embodiment, the cost function can depend upon measured quantities such as timing and/or wire length. For example, a sum of various metrics can be used to evaluate the goodness of an incremental placement of the critical region. The metrics can include, but are not limited to, wire length and timing criticality. A site with the best sum of the noted metrics can be selected as the location for a particular block. In this example, timing criticality is determined using an estimate of the path delay(s). Since the region is being optimized for timing, timing can be given a greater weight than wire length. Still, wire length can be a parameter of the cost function since disregarding wire length may result in an inferior or problematic routing at a later time.

In step 445, a determination can be made as to whether one or more exit criteria have been met. Such criteria can include, but are not limited to, a maximum number of iterations of the incremental component placement technique 425, a placement for the critical region which results in a value of the cost function that conforms to predetermined requirements, or the like. In any case, if one or more exit criteria are met, the method can end. If not, the method can loop back to step 430 to continue placement optimization for the RUO.

Figure 5:
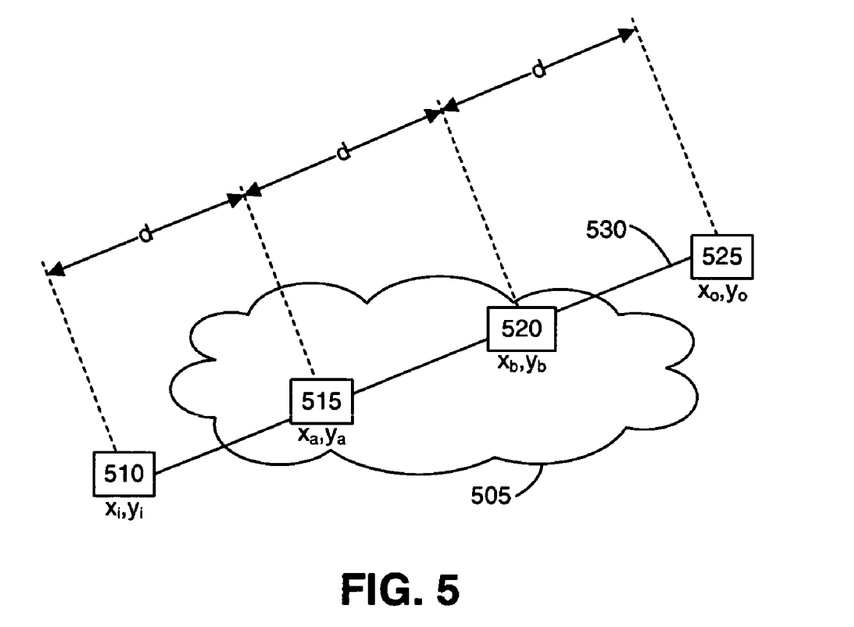
FIG. 5 is a block diagram illustrating a region of a circuit design in accordance with another embodiment of the present invention.

FIG. 5 is a block diagram illustrating region 505 of a circuit design in accordance with another embodiment of the present invention. In this embodiment, region 505 has been identified as an example of a critical region and has been optionally re-synthesized and further optimized using a non-exhaustive block placement technique. The block placement technique illustrated in FIG. 5 seeks to distribute blocks of critical region 505 along a path between the input block 510 and the output block 525. Blocks 515 and 520 are distributed along, or proximate to, a straight line 530 defined by the coordinates of the input block 510 and the output block 525.

As shown, input block 510 has coordinates of $(x_i, y_i)$ and output block 525 has coordinates of $(x_o, y_o)$. From these coordinates, a slope can be determined. Each of blocks 515 and 520 of region 505 can be positioned along, or proximate to, a pivot point located along line 530 running from input block 510 to output block 525. The placement of pivot points at which blocks 515 and 520 are located can be such that the linear distance d between blocks 510, 515, 520, and 525 can be equivalent, or substantially equivalent.

The locations of pivot points along line 530 can be determined by levelizing the blocks. Levelizing blocks refers to establishing an ordering of the blocks according to their connectivity with respect to one another. In illustration, block 510 drives block 515, which drives block 520, which in turn drives block 525, thereby establishing an order based upon connectivity.

In one embodiment, levelizing can include assigning blocks that receive input from the input block 510 a level of one. Blocks that drive the output block 525 can be assigned a level of N. Other blocks of the critical region can be assigned a level of L, where 1<L<N, where L and N are positive integers. The level L assigned to a particular block can correspond to its order with respect to the signal chain from input block 510 to output block 525. Thus, block 515 can be assigned a level of 1, while block 525 can be assigned a level of two, which in this case corresponds to N. It should be appreciated, however, that if the critical region includes more than two blocks, more levels can be used. For example, the number of total levels N can be the number of total blocks within the critical region.

Notwithstanding the above, in another embodiment, more than one block can be assigned to a same pivot point. In this regard, for example, a total of three levels can be established where blocks driven by the input block are assigned level one, blocks that drive the output block(s) are assigned level three, and all other blocks within the critical region are assigned a level of two. Blocks assigned to level two can be connected to either the level one blocks, the level two blocks, or both the level one and level two blocks.

Figure 6:
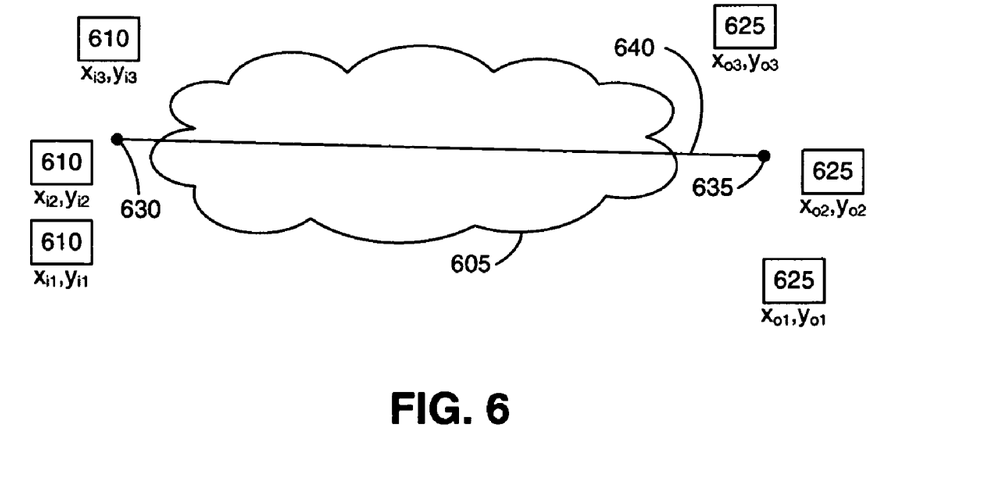
FIG. 6 is a block diagram illustrating a technique for determining possible locations for blocks of a region to be optimized in accordance with another embodiment of the present invention.

FIG. 6 is a block diagram illustrating a technique for determining possible locations for blocks of a RUO in accordance with another embodiment of the present invention. FIG. 6 illustrates the case where multiple input blocks 610 drive the RUO 605 and/or multiple output blocks 625 are driven by RUO 605. In such cases, an average of the coordinates of input blocks 610 and/or output blocks 625, as the case may be, can be calculated to determine the coordinates of the endpoints of line 640. Once the endpoints 630 and 635 are calculated, the slope of line 640 can be determined.

In illustration, the coordinates for the starting point 630 of the line can be determined using the following formula: $(x_{start}, y_{start}) = [(x_{i1}+x_{i2}+x_{i3})/3, (y_{i1}+y_{i2}+y_{i3})/3]$. The coordinates for the ending point 635 of the line can be determined using the following formula: $(x_{end}, y_{end}) = [(x_{o1}+x_{o2}+x_{o3})/3, (y_{o1}+y_{o2}+y_{o3})/3]$.

Figure 7:
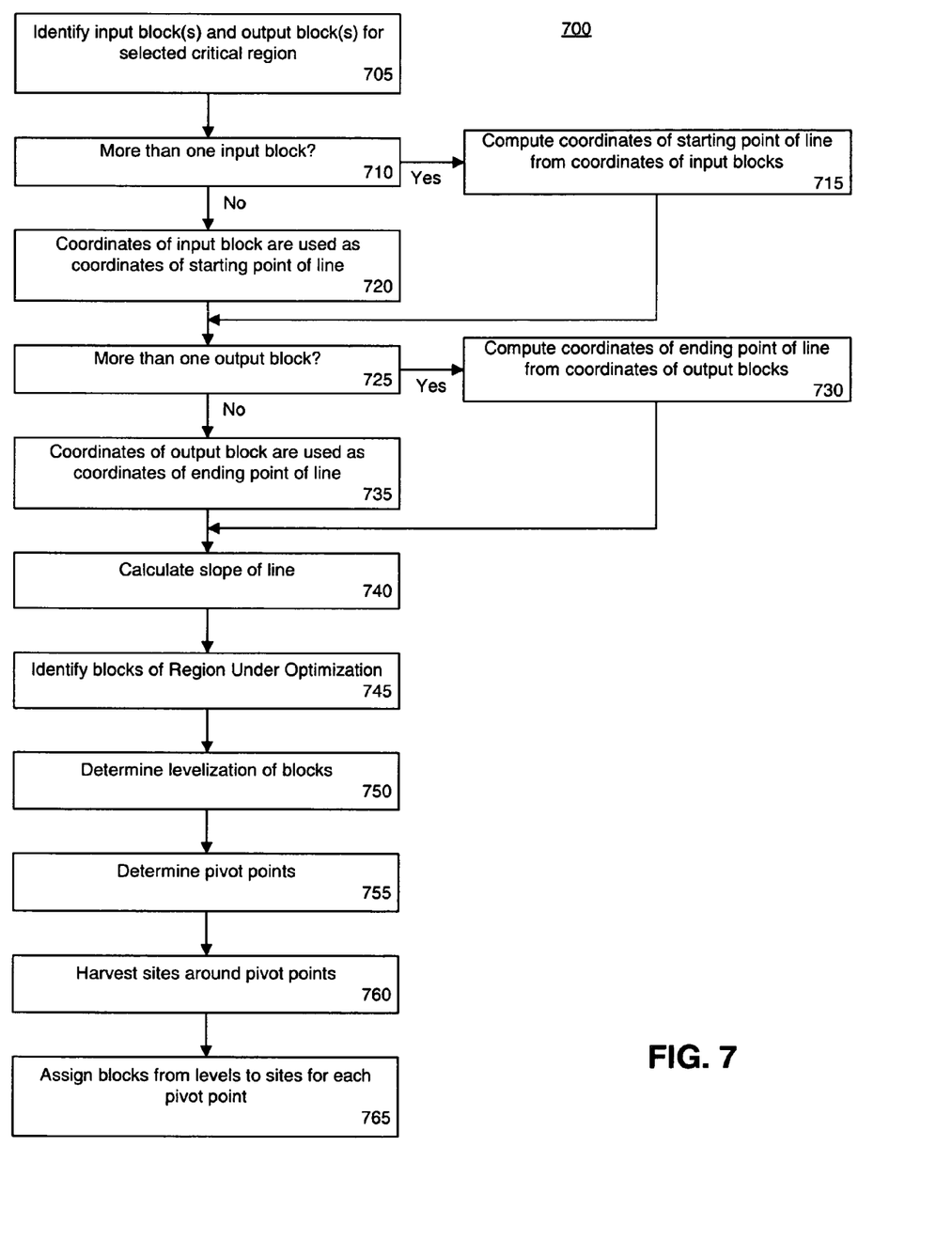
FIG. 7 is a flow chart illustrating a method of optimizing and incrementally placing a region of a circuit design in accordance with another embodiment of the present invention.

FIG. 7 is a flow chart illustrating a method 700 of optimizing and incrementally placing a region of a circuit design in accordance with another embodiment of the present invention. More particularly, method 700 illustrates another embodiment of a placement technique which can be applied to a RUO. In one embodiment, for example, method 700 can be used as a placement technique in lieu of step 420 of FIG. 4. As such, method 700 can begin in a state where a circuit design has been initially placed, a timing analysis has been performed, and one or more critical regions have been identified. Further, a particular critical region can be selected for optimization and optionally re-synthesized using one or more transformation techniques.

Accordingly, in step 705, the input block(s) and output block(s) for the selected critical region can be identified. In step 710, a determination can be made as to whether the selected critical region has more than one input block. If so, the method can proceed to step 715. If not, the method can continue to step 720. In step 715, coordinates for the starting point of a line from the input blocks to the output block(s) can be calculated. As discussed, the coordinates of the starting point can be determined by averaging the coordinates of the different input blocks of the selected region. After step 715, the method can proceed to step 725. In step 720, in the case where the selected region has a single input block, the coordinates of the input block can be used as the coordinates of the starting point of the line. After step 720, the method can continue to step 725.

In step 725, a determination can be made as to whether the selected region has more than one output block. If so, the method can proceed to step 730. If not, the method can continue to step 735. In step 730, coordinates for the ending point of the line can be calculated. Similar to the case where the selected region has a plurality of input blocks, the coordinates of the ending point can be determined by averaging the coordinates of the different output blocks of the selected region. After step 730, the method can proceed to step 740. In step 735, in the case where the selected region has a single output block, the coordinates of the output block can be used as the coordinates of the ending point of the line. After step 735, the method can continue to step 740.

In step 740, the slope of the line can be calculated using the coordinates of the starting point and the ending point. In step 745, the blocks of the selected region can be identified. In step 750, the critical region can be levelized. As noted, levelization can include associating the blocks of the critical region with a predetermined number of levels, whether one, two, three, or N. More than one block can be assigned to a same level depending upon the particular number of levels permitted and the number of blocks in the critical region.

In step 755, pivot points along the line can be determined. One pivot point can be created or placed along the line for each level. The pivot points, in general, determine spacing between consecutive levels. The length of the line can be subdivided into X+1 equivalent segments, where X corresponds to the number of levels, and thus pivot points at which blocks will be located. The distance between consecutive pivot points on the line will be a distance equal to, or approximately, d, where d=(length of the line)/(X+1). The distance from the starting point to the first pivot point on the line and the distance from the last pivot point on the line to the ending point also will be equal to, or approximately, d.

In step 760, one or more sites proximate to each pivot point can be identified or harvested. In one embodiment, for example, available sites within a predetermined area surrounding each pivot point can be identified. In another embodiment, available sites located not more than a predetermined distance from each pivot point can be identified. It should be appreciated that if a particular block of a level requires a specialized site, and such a site is not located either within the predetermined distance from the pivot point or within the predetermined area surrounding the pivot point, then the closest available site that meets the requirements of the block can be harvested, or selected.

In step 765, blocks can be assigned to available sites surrounding each pivot point. More particularly, the blocks for each level can be assigned to sites harvested for the pivot point corresponding to that level. In cases where one block exists in a given level, that block can be located at an appropriate site harvested for the pivot point as discussed. If more than one block exists in a given level, each block can be assigned to an appropriate site that has been harvested for that level.

It should be appreciated that the placement technique disclosed with reference to FIG. 7 can provide a fast and efficient approximation of a final placement of the RUO, i.e., the selected region. Still, if so desired, a simple cost-function that is dependent upon timing and wire-length can be used to further optimize the selected region.

The embodiments disclosed herein provide a technique for optimizing selected portions of a circuit design post-placement. Timing critical portions of the circuit design can be optionally re-synthesized and incrementally placed on a target device. In one embodiment, an exhaustive placement technique can be applied, but limited to operation within the selected region. In another embodiment, a non-exhaustive technique can be applied to the selected region. In either case, the embodiments disclosed herein allow one or more portions of a circuit design to be optimized without having to perform multiple iterations between circuit re-design and place and route functions. Moreover, because the entire circuit design is not optimized at the same time, the number of netlist regions, and therefore the number of blocks to be relocated and sites to be considered, also is significantly reduced, thereby saving significant time.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language).

This invention can be embodied in other forms without departing from the spirit or essential attributes thereof. Accordingly, reference should be made to the following claims, rather than to the foregoing specification, as indicating the scope of the invention.

We claim:

1. A method of optimizing a portion of a circuit design for a target device comprising:
    identifying a critical region from a plurality of regions after an initial placement of the circuit design on the target device, wherein the critical region includes at least one input block and at least one output block, and wherein a perimeter of the critical region is determined according to coordinates of each input block and each output block of the critical region as placed on the target device;
    relocating blocks of the critical region to different sites within the perimeter of the critical region;
    evaluating the relocation of blocks of the critical region according to a cost function; and
    continuing to relocate blocks and evaluate the relocation of blocks in the critical region until at least one exit criterion is met.

2. The method of claim 1, further comprising re-synthesizing the critical region prior to the relocation and evaluation of blocks.

3. The method of claim 2, wherein the critical region has a predetermined functionality, said method further comprising preserving the functionality of the critical region when re-synthesizing the critical region.

4. The method of claim 1, further comprising including each block located on a path between the input block and the output block of the critical region as part of the critical region.

5. The method of claim 1, wherein relocating blocks further comprises selecting only blocks within the critical region for relocation to other sites within the critical region.

6. The method of claim 1, wherein continuing to relocate blocks and evaluate the relocation of blocks further comprises comparing a result obtained from an evaluation of the cost function with a predetermined exit criterion.

7. The method of claim 1, wherein continuing to relocate blocks and evaluate the relocation of blocks further comprises:
    determining a number of relocation and evaluation iterations; and
    comparing the number of iterations with a predetermined exit criterion.

8. A machine readable storage, having stored thereon a computer program having a plurality of code sections comprising:
    code for identifying a critical region from a plurality of regions after an initial placement of the circuit design on a target device, wherein the critical region is defined by at least one input block and at least one output block, and wherein a perimeter of the critical region is determined according to coordinates of each input block and each output block of the critical region as placed on the target device;

code for relocating blocks of the critical region to different sites within the perimeter of the critical region;

code for evaluating the relocation of blocks of the critical region according to predetermined criteria; and code for continuing to relocate blocks and evaluate the relocation of blocks in the critical region until at least one exit criterion is met.

9. The machine readable storage of claim 8, further comprising code for re-synthesizing the critical region that is operative prior to the code for relocating and the code for evaluating blocks.

10. The machine readable storage of claim 8, further comprising code for including each block located on a path between the input block and the output block of the critical region as part of the critical region.

11. The machine readable storage of claim 8, wherein the critical region has a defined functionality, said machine readable storage further comprising code for re-synthesizing the critical region while preserving the functionality of the critical region.

12. The machine readable storage of claim 8, wherein the code for relocating blocks further comprises code for selecting only blocks within the critical region for relocation to other sites within the critical region.

13. The machine readable storage of claim 8, wherein the code for continuing to relocate blocks and evaluate the relocation of blocks further comprises code for comparing a result obtained from an evaluation of the cost function with a predetermined exit criterion.

14. The machine readable storage of claim 8, wherein the code for continuing to relocate blocks and evaluate the relocation of blocks further comprises:

code for determining a number of relocation and evaluation iterations; and code for comparing the number of iterations with a predetermined exit criterion.

* * * * *